United States Patent [19]
Liu et al.

[11] Patent Number: 6,025,615
[45] Date of Patent: Feb. 15, 2000

[54] MICROWAVE HETEROJUNCTION BIPOLAR TRANSISTORS WITH EMITTERS DESIGNED FOR HIGH POWER APPLICATIONS AND METHOD FOR FABRICATING SAME

[75] Inventors: William Uei-Chung Liu, Dallas; Darrell Glenn Hill, Plano, both of Tex.

[73] Assignee: Texas Instruments Incorporated, Dallas, Tex.

[21] Appl. No.: 08/363,479

[22] Filed: Dec. 23, 1994

Related U.S. Application Data

[62] Division of application No. 08/159,758, Nov. 30, 1993, Pat. No. 5,389,554, which is a continuation of application No. 08/032,779, Mar. 16, 1993, abandoned, which is a continuation of application No. 07/856,106, Mar. 23, 1992, abandoned.

[51] Int. Cl.$^7$ ................................................ H01L 31/0328
[52] U.S. Cl. ............................................. 257/198; 257/191
[58] Field of Search .................................... 257/197, 198, 257/12, 183, 191

[56] References Cited

U.S. PATENT DOCUMENTS

| | | | |
|---|---|---|---|
| 4,617,724 | 10/1986 | Yokoyama et al. | 257/197 |
| 4,728,616 | 3/1988 | Ankri et al. | 437/31 |
| 4,751,195 | 6/1988 | Kawgi | 437/31 |
| 4,924,283 | 5/1990 | Ohshima | 257/198 |
| 4,965,650 | 10/1990 | Inada et al. | 257/198 |
| 4,996,166 | 2/1991 | Ohshima | 437/133 |
| 5,212,103 | 5/1993 | Shimura | 437/31 |
| 5,289,020 | 2/1994 | Hirose et al. | 257/198 |
| 5,401,999 | 3/1995 | Bayraktaroglu | 257/198 |

FOREIGN PATENT DOCUMENTS

| | | | |
|---|---|---|---|
| 430086 | 6/1991 | European Pat. Off. | 257/197 |
| 2 164 634 | 8/1973 | France . | |
| 28 47 451 | 6/1980 | Germany . | |
| 62-36861 | 2/1987 | Japan | 257/198 |

OTHER PUBLICATIONS

Guan-bo Gao, et al., "Emitter Ballasting Resistor Design for and Current Handling Capability of AlGaAs/GaAs Power Heterojunction Bipolar Transistors,", *IEEE Transactions on Electron Devices*, vol. 38, No. 2, pp. 185–196, Feb. 1991.

Richard H. Winkler, "Thermal Properties of High–Power Transistors," *IEEE Transactions on Electron Devices*, vol. ED–14, No. 5, pp. 260–263, May 1967.

Robert P. Arnold, et al., "A quantitative Study of Emitter Ballasting", *IEEE Transactions on Electron Devices*, vol. ED–21, No. 7, pp. 385–391, Jul. 1974.

S. M. Sze, *Physics of Semiconductor Devices*, Second Edition, pp. 169–175.

P. Launay, B. Bamueni, A. Duchenois, P. Blanconnier, "Self–Aligned AlGaAs/GaAs HBT's with Tungsten N and P Type Ohmic Contacts", *Microelectronic Engineering*, vol. 15, No. 1/4, Oct. 1991, pp. 161–164.

A. Lahav and M. Genut, "Study of Tungsten and WSi Refractory Ohmic Contacts to Graded–Gap InGaAs/GaAs/AlGaAs Heterostructures", *Materials Science and Engineering*, vol. B7, No. 3, Dec. 1990, pp. 231–235.

"500mA AlGaAs/GaAs Power Heterojunction Bipolar Transistor," *Electronics Letters*, vol. 25, No. 21, pp. 1447–1448, Oct. 12, 1989.

*Primary Examiner*—Jerome Jackson, Jr.
*Assistant Examiner*—B W Baumeister
*Attorney, Agent, or Firm*—Michael K. Skrehot; Christopher L. Maginniss; Richard L. Donaldson

[57] ABSTRACT

In one form of the invention, an emitter structure for a bipolar transistor is disclosed. The structure is comprised of an emitter layer 6 of $Al_xGa_{1-x}As$, where x>0.4, abutting a base layer 8.

16 Claims, 2 Drawing Sheets

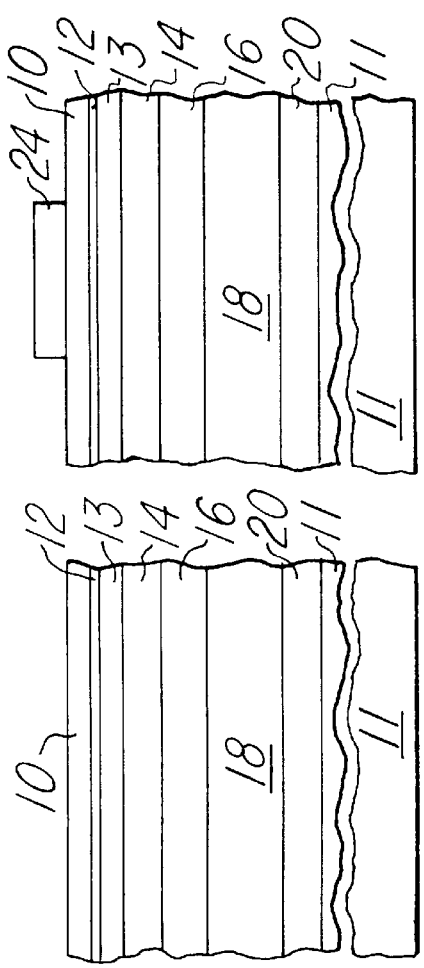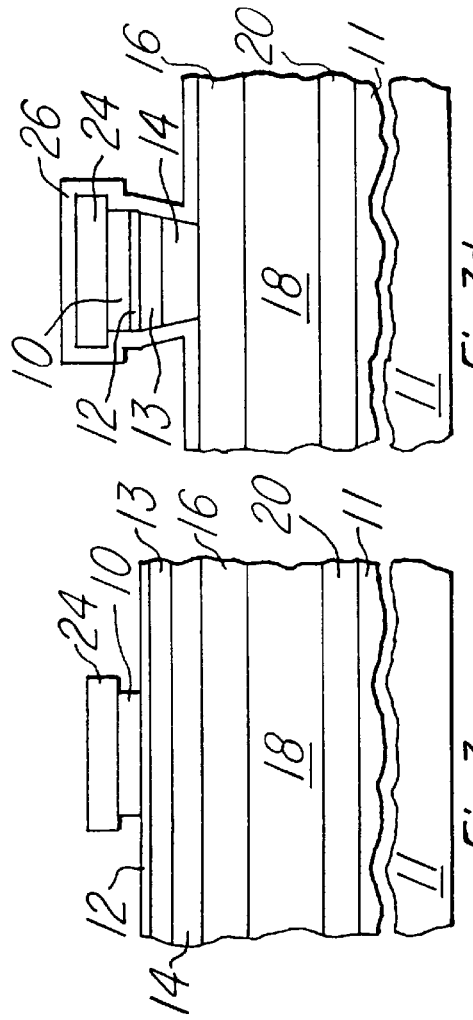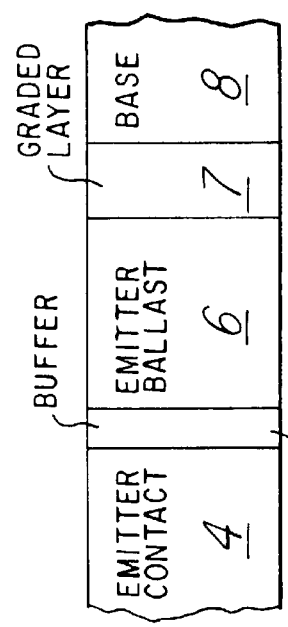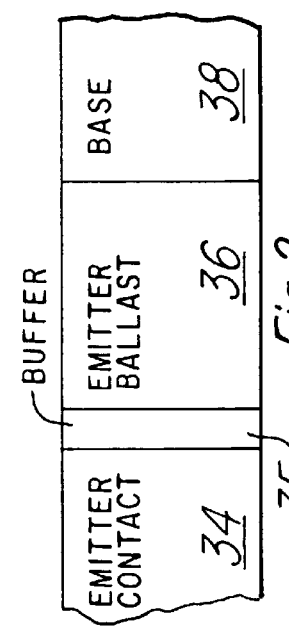

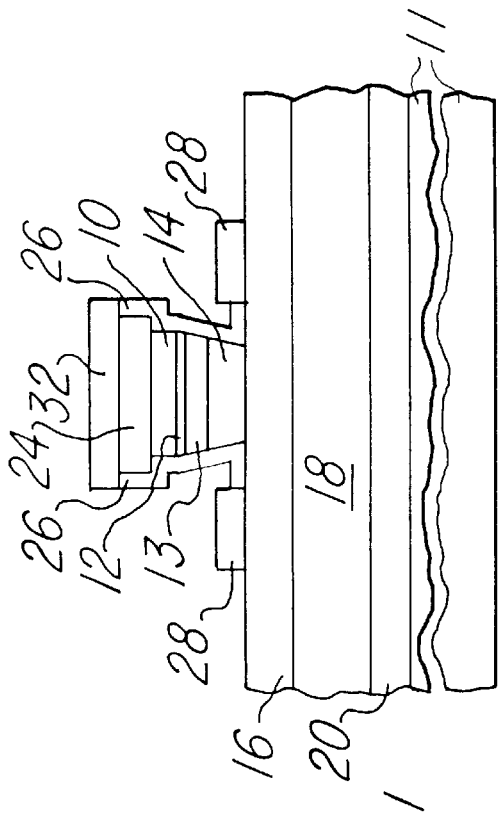
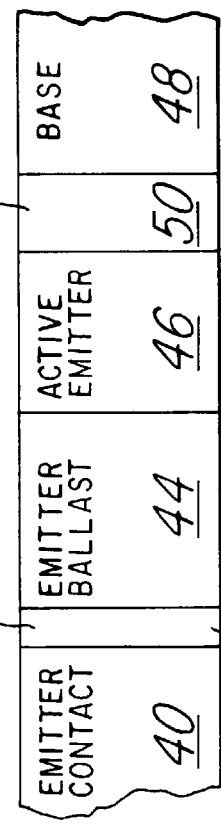
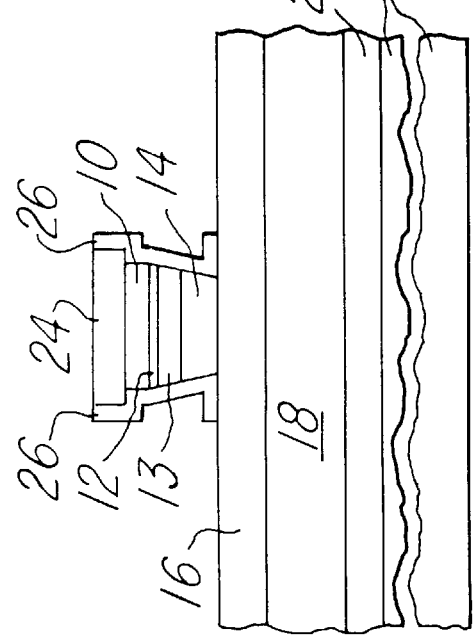
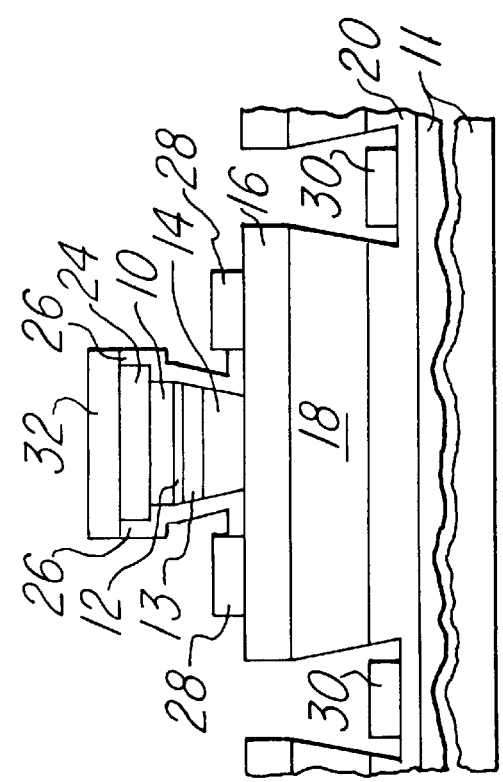

6,025,615

MICROWAVE HETEROJUNCTION BIPOLAR TRANSISTORS WITH EMITTERS DESIGNED FOR HIGH POWER APPLICATIONS AND METHOD FOR FABRICATING SAME

This is a division of application Ser. No. 08/159,758, filed Nov. 30, 1993, now U.S. Pat. No. 5,389,554, which was a continuation of application Ser. No. 08/032,779, filed on Mar. 16, 1993, now abandoned, which was a continuation of application Ser. No. 07/856,106, filed on Mar. 23, 1992, now abandoned.

NOTICE (C) Copyright, *M* Texas Instruments Incorporated 1992. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

1. Field of the Invention

This invention generally relates to microwave heterojunction bipolar transistors for high power applications.

2. Background of the Invention

Without limiting the scope of the invention, its background is described in connection with heterojunction bipolar transistors (HBTs), as an example.

Heretofore, in this field, heterojunction bipolar transistors have suffered from performance degradation and catastrophic failure when operated under high power conditions. The cause of these problems has generally been attributed to that of a condition of positive feedback between transistor current and either the base-emitter or base-collector junction temperature. High power HBTs typically have multiple emitter fingers so that the transistor can handle higher currents. The problem of positive feedback occurs when localized heating occurs on one of the emitter fingers, forming a "hot spot". As the junction temperature rises in the vicinity of the hot spot, the collector current increases in the finger. The larger current causes the junction temperature to rise further, thereby inducing more current to flow. Eventually, the total current in the multi-finger transistor attempts to flow through the single finger, thus leading to thermal runaway and a catastrophic failure. Past solutions to this problem have relied on a resistor in series with each emitter finger having a positive relation of resistance to temperature. Therefore, as the current through the finger increases with rising junction temperature, the same increased current flow through the emitter, or "ballast", resistor causes an increase in resistance that limits the emitter-collector current through the emitter finger. This technique, the use of ballast resistors external to the transistor, has been in use for many years. See S. M. Sze, *Physics of Semiconductor Devices,* 2nd Edition, p169. Only with the recent development of deposition techniques such as Molecular Beam Epitaxy (MBE) and Metal-Organic Chemical Vapor Deposition (MOCVD), has it become possible to incorporate the ballast resistor into the transistor structure. Emitter ballast layers of lightly doped GaAs have been used in HBTs, see Gao, et. al, IEEE Transactions on Electron Devices, vol. 38, 2, pp. 185–196, February 1991.

In addition to the catastrophic "collapse" phenomenon, a negative differential resistance (NDR) is observed in the current-voltage curves of typical HBTs operated at moderate power levels where junction temperature is increased. However, unlike "collapse", NDR is characterized by a gradual decrease in current gain as the power level increases. This NDR problem can be seen in a single emitter finger transistor, whereas the collapse phenomenon is usually seen in multiple finger devices. The cause of the NDR characteristic is thought to be that of decreasing emitter injection efficiency as the junction temperature increases. The problems of collapse and NDR seem to be related to the design of the emitter of the HBT, therefore an emitter design that overcomes these problems is desirable.

SUMMARY OF THE INVENTION

It is herein recognized that a need exists for a Heterojunction Bipolar Transistor designed to overcome the problems of collapse and negative differential resistance under high power conditions. Past solutions to the problem of collapse, or "hot spotting" have included external ballast resistors and GaAs ballast layers within the HBT material structure. External ballast resistors typically have the problems of increased size and the fact that the resistor is phyically separated from the junction that it is desired to compensate. HBTs with GaAs or conventional AlGaAs ballast layers overcome these problems, but have the additional problem of space charge conduction. In order to get a highly resistive GaAs or conventional AlGaAs layer, the layer is required to be very lightly doped and relatively very thick. Because of the light level of doping, carriers injected into the layer easily exceed in number the carriers introduced by doping. Consequently, the resistivity of the layer changes with the level of injection, and thus the emitter ballast resistance changes with bias. This is an undesirable situation that the present invention overcomes.

The NDR problem can be shown to be related to the difference of energies experienced by the majority carriers as they traverse base-emitter junction. The band difference between the traditional HBT emitter material, $Al_{0.3}Ga_{0.7}As$, and the GaAs base is insufficient to allow operation at high power and the elevated temperatures associated therewith. The present invention overcomes this problem.

Generally, and in one form of the invention, an emitter structure for a bipolar transistor is disclosed. The structure is comprised of an emitter layer of $Al_xGa_{1-x}As$, where x>0.4, abutting a base layer. In another form of the invention a bipolar transistor is disclosed. The transistor is comprised of a substrate, a subcollector layer, a collector layer, a base layer, and an emitter layer of $Al_xGa_{1-x}As$, where x>0.4.

An advantage of the invention is that the AlGaAs layer acts as both a ballast resistor and as the active emitter for the transistor.

BRIEF DESCRIPTION OF THE DRAWINGS

In the drawings:

FIG. 1 is a schematic view of a first preferred embodiment of the present invention;

FIG. 2 is a schematic view of a second preferred embodiment of the present invention;

FIGS. 3a–3g are cross-sectional views showing the steps of a third preferred embodiment fabrication process of the present invention;

FIG. 4 is a schematic view of a fourth preferred embodiment of the present invention.

Corresponding numerals and symbols in the different figures refer to corresponding parts unless otherwise indicated.

DETAILED DESCRIPTION OF PREFERRED EMBODIMENTS

With reference to FIG. 1, a first preferred embodiment of the present invention is described hereinbelow which increases the power output of heterojunction bipolar transistors by ensuring that current gain does not drop at the high junction temperatures that result from high power levels. The invention also simplifies making vertical emitter ballast resistors out of epitaxial material. However, before describing the first preferred embodiment, a discussion of the physics behind the problems of negative differential resistance (NDR) and collapse in HBTs would be helpful.

Power HBTs are designed to deliver a large amount of power at high frequencies. In order to increase the HBT's capability in handling high voltages and large currents, designers typically employ a multi-finger geometry in the transistor layout. However, the current gain of typical HBTs is found to decrease at high power levels due to decreasing emitter injection efficiency as temperature increases. This reduction is current gain results in two undesirable phenomena observed in the multi-finger HBT common-emitter output characteristics: Negative Differential Resistance (NDR), and the collapse. This invention utilizes a novel design in the emitter of HBTs to prevent both of the mentioned problems from occurring for a given power output per number of emitter fingers.

The following discussion details the probable physical causes of the two undesirable problems occurring in typical HBTs. First, we will describe the NDR phenomenon, which is a gradual decrease of current gain as power level increases. Assuming that gain is limited by the base transport factor $\alpha_T$ and the emitter injection efficiency $\gamma$ (ie., avalanche impact ionization occurring in the base-collector junction may be neglected), HBT current gain $\beta$ is given by, $$\beta(I_c) = \frac{\alpha_T \cdot \gamma(T(I_c))}{1 - \alpha_T \cdot \gamma(T(I_c))} \quad (1)$$

where $T(I_c)$ refers to junction temperature as a function of collector current $I_c$.

The emitter injection efficiency of HBTs decreases as junction temperature increases according to the relation:

$$\gamma = \frac{1}{1 + \frac{D_E}{D_B}\frac{N_B}{N_E}\frac{W_B}{W_E}\exp\left(-\frac{\Delta E_a}{kT}\right)} \quad (2)$$

$$\cong 1 - \frac{D_E}{D_B}\frac{N_B}{N_E}\frac{W_B}{W_E}\exp\left(-\frac{\Delta E_a}{kT}\right)$$

where $D_E$ and $D_B$ are minority carrier diffusivities in the emitter and base, $N_E$ and $N_B$ are doping densities of the emitter and base, and $W_E$ and $W_B$ are the emitter and base thicknesses respectively; $\Delta E_a$ is the effective energy barrier between the bulk base and emitter (i.e. the energy difference experienced between the electrons in the emitter and holes in the base) and k is Boltzmann's constant.

To clarify the dependence of current gain on temperature, some approximations can be made. $\alpha_T$ and $\gamma$ are both close to unity at room temperature for cases of interest; $\alpha_T$ increases slightly with temperature, so that the current gain decrement is dominated by $\gamma$ at elevated temperatures. Therefore, $\alpha_T$ may be approximated as unity, and equation (1) may be rewritten as $\beta \cong 1/(1-\gamma)$. Combining with (2) gives $$\beta \cong \frac{D_B}{D_E}\frac{N_E}{N_B}\frac{W_E}{W_B}\exp\left(+\frac{\Delta E_a}{kT}\right) \quad (3)$$

This expression clearly demonstrates that current gain $\beta$ decreases with increasing junction temperature T, which is determined by the device power level by the expression, $$T(I_c) = T_A + R_{th} \cdot I_c \cdot V_{ce} \quad (4)$$

where $T_A$ is ambient temperature, $R_{th}$ is the device thermal resistance (in °C. per Watt), $I_c$ is collector current, and $V_{ce}$ is collector-emitter bias potential. The current gain therefore decreases as power level ($I_c \cdot V_{ce}$) increases.

In contrast to NDR, collapse is marked by a sudden decrease of current gain as the power level increases. It should be noted that NDR is observed for HBTs operated at moderate power levels where junction temperature is increased Collapse, on the other hand, is generally seen only for multiple-emitter-finger HBTs designed to handle very high power.

The collector current collapse phenomenon is related to NDR. In order to understand this phenomenon, however, it must be noted that: as junction temperature increases, the turn-on voltage (i.e., the bias required to obtain some arbitrary current level) decreases in semiconductors. The case of multiple-emitter-finger HBTs can be considered as several identical HBTs connected in parallel. At low to moderate junction temperatures, the fixed base current is distributed evenly among the HBTs, the current gains are identical, and so the collector currents are also identical. However, at sufficiently high junction temperatures, the situation becomes unstable. If one HBT gets very slightly warmer than the others, then its emitter-base junction turn-on voltage becomes slightly lower. Since its turn-on voltage is lower, and all the HBTs are biased at the same voltage (since they are connected in parallel), the warmer HBT will be turned on more strongly and will conduct more current. The total base current (for all of the HBTs) is fixed; therefore, when the warmer HBT conducts more current, the other HBTs conduct less. Since the warmer HBT is now conducting more current than the others, the temperature difference becomes even greater, and the instability grows until the hot HBT is drawing almost all of the base current, with the other devices contributing very little.

Quantitatively, one can define a critical current, $I_{critical}$, as $$I_{critical} = N \cdot \frac{kT_A}{q} \frac{1}{R_{th} \cdot \Phi \cdot V_{ca} - R_a} \quad (5)$$

where N is the number of fingers. $\phi$ is the negative of the rate of change of base-emitter voltage per temperature change for constant emitter current and it is experimentally determined for AlGaAs-GaAs junction to be in the range of 1.5 to 2.0 mV/°C. $R_e$ is the ballast resistance per emitter finger. When the operating total collector current is smaller than $I_{critical}$, each finger shares an equal amount of current. Conversely, when the power level increases and the total collector current is greater than $I_{critical}$, one finger suddenly dominates the entire collector current, causing the junction temperature at that finger to increase dramatically and thus the current gain suddenly decreases.

The first preferred embodiment of the invention is shown in FIG. 1. A heavily doped (i.e. approximately $>1\times10^{19}$ atoms/cm$^3$) InGaAs emitter contact layer 4 is positioned next to a lightly doped (i.e. approximately $5\times10^{18}$ atoms/ cm$^3$) GaAs buffer layer 5 having a thickness of approximately 100 Angstroms. The GaAs buffer layer 5 is interposed between the emitter contact layer 4 and the emitter ballast layer 6. The interface between the emitter ballast layer 6 and the base layer 8 is a layer 7 in which the Al mole fraction is decreased from that of the emitter ballast layer 6 at one interface to none at the interface with the base layer 8. The emitter ballast layer 6 is composed of Al$_x$Ga$_{1-x}$As, where x>0.4. The emitter ballast layer 6 is doped to a concentration of approximately 5×10$^{17}$ atoms/cm$^3$. In a second preferred embodiment of the invention, shown in FIG. 2, a heavily doped (i.e. approximately >1×10$^{19}$ atoms/cm$^3$) InGaAs emitter contact layer 34, is positioned next to a lightly doped (i.e. approximately 5×10$^{18}$ atoms/cm$^3$) GaAs buffer layer 35 having a thickness of approximately 100 Angstroms. The GaAs buffer layer 35 is interposed between the emitter contact layer 34 and the emitter ballast layer 36. The interface between the emitter ballast layer 36 and the base layer 38 is abrupt. The emitter ballast layer 36 is composed of Al$_x$Ga$_{1-x}$As, where x>0.4. The emitter ballast layer 36 is doped to a concentration of approximately 5×10$^{17}$ atoms/cm$^3$. The NDR and collapse problems are largely solved by the increased aluminum composition in the AlGaAs emitter. The minimum aluminum composition required for a particular HBT emitter is calculated for operation at a given desirable power output per number of emitter fingers. The physical explanation as to how the proposed solution prevents both of the problems is described as follows.

Firstly, from Eq. (5), it is observed that the critical current can be increased by increasing the emitter ballast resistance per finger, $R_e$. Consequently, the collapse phenomenon is prevented by increasing $R_e$. In general, this ballast resistor can be added externally to each of the fingers of the device. However, this implementation suffers the drawbacks of the need for additional wafer area allocated for the resistors in the transistor layout design and the extra procedure needed during processing. A better implementation is to epitaxially grow resistive layers on top of the emitter layer, thus introducing the required emitter resistances. Note that this implementation has the distinct advantages of uniformity and reproducibility in the resistance value for all the emitter fingers since the epitaxial layers grown by techniques such as MBE and MOCVD are known to be very uniform and reproducible.

This latter implementation, however, does not work well if the additionally grown epitaxial layers are made of GaAs, which is the typical emitter cap layers of an HBT, or of Al$_{0.3}$Ga$_{0.7}$As, which is the typical active emitter material used to form the heterojunction. This is because in AlGaAs with aluminum composition smaller than approximately 40%, the electrons which are associated with the small-effective-mass Γ valley have rather high mobilities. Consequently, in order to obtain $R_e$ in the desirable range of roughly 1Ω for practical device geometries, one would have to grow an impractical thickness (>1 μm) for the ballast resistor layer with a doping of >10$^{16}$/cm$^3$. The thickness could be reduced if a lower doping is chosen; however, the lighter doped layer would not be characterized by a constant, known resistance value due to space charge conduction, similar to the fact that the 'i' layer in a p-i-n diode cannot be simply treated as a constant high resistive region during operation. In contrast, in a high aluminum composition AlGaAs layer, the electrons are associated with the large-effective-mass X band, thus having much lower mobilities. A practical value of $R_e$ can thus be obtained with an epitaxial layer of practical thickness at a doping high enough to prevent the space charge conduction in the emitter. Therefore, the use of a high aluminum composition (>40%) AlGaAs emitter is needed to provide the required ballast resistance to prevent the collapse phenomenon.

Once the collapse phenomenon is prevented, one would like to further eliminate the occurrence of NDR. That is, if only the collapse problem is solved with the ballast resistors, but not the NDR, every finger conducts an equal amount of current, but all at a very small current gain due to the device heating as $V_{ce}$ is increased. It is noted that by increasing the effective barrier height $\Delta E_a$ of the emitter-base heterojunction, current gain is maintained at high junction temperatures (and therefore high power levels). Therefore, the aforementioned solution of increasing the emitter aluminum content can be also applied here to eliminate the NDR for a given desired power output.

As seen from Eq. (3), the reduction in current gain due to device heating can be prevented by increasing $\Delta E_a$, which is equal to the base-emitter bandgap difference for a graded junction, or equal to the valence band discontinuity for an abrupt junction. For a graded junction in GaAs/Al$_x$Ga$_{1-x}$As, $$\Delta E_a (\text{in } eV) = \begin{array}{ll} 1.247 \cdot x & x \leq 0.45 \\ 1.9 + 0.125 \cdot x + 0.143 \cdot x^2 - 1.424 & x > 0.45 \end{array} \quad (6)$$

and for an abrupt junction in the same system, $$\Delta E_a (\text{in eV}) = 0.55 \cdot x \quad (7)$$

It is evident from the above two equations that a graded base-emitter junction with high aluminum content is preferred. The following calculation specifies the minimum aluminum content needed for a given operating power level before the device is rendered useless, i.e. when the device current gain decreases to below 10. Quantitatively, this condition is achieved if the factor of exp($\Delta E_a$/kT) reaches 5×10$^3$, since the factor in front of this exponential in Eq. (3) is typically 0.002 for power HBTs. Furthermore, because the value of thermal resistance per finger typically ranges from 700–900° C./W, $R_{th}$ of 900° C./W is used in this calculation so that the result applies for the minimum aluminum content needed. It is assumed that the ambient is at the room temperature and the base-emitter junction is graded. If the base-emitter junction were abrupt, the required aluminum composition would be even higher than listed here for a given power output per number of fingers.

| Power/finger (Watt) | Aluminum composition |
|---|---|
| 0.23 | 0.3 |
| 0.52 | 0.45 |
| 0.58 | 0.6 |
| 0.63 | 0.7 |
| 0.68 | 0.8 |
| 0.80 | 1.0 |

With reference to FIGS. 3a–3g, a method for fabricating a third preferred embodiment of the present invention is described hereinbelow.

(a) A substrate material for this process is shown in FIG. 3a; note that the vertical is exaggerated in the drawings for clarity. It is composed of a semi-insulating semiconductor material 11 (such as GaAs).

(b) A sub collector layer 20 of n-type GaAs, for example, is epitaxially grown on the substrate 11 by a suitable process (such as Molecular Beam Epitaxy (MBE) or Metal Organic Chemical Vapor Deposition (MOCVD)) to a thickness of 1 µm and doped with Si to a concentration of approximately $5 \times 10^{18}$ cm$^{-3}$.

(c) A collector layer 18 is epitaxially grown on subcollector layer 20 to a thickness of 1 µm, doped at approximately $1 \times 10^{16}$ cm$^{-3}$ and is preferably made of GaAs.

(d) A base epilayer 16 of GaAs, for example, is deposited onto collector layer 18 to a thickness of 0.08 µm and doped with C, for example, to a concentration of approximately $\leq 3 \times 10^{19}$ cm$^{-3}$.

(e) Emitter ballast epilayer 14 of n-type Al$_x$Ga$_{1-x}$As, where x>0.4, is then deposited onto base layer 16 at a thickness of 0.2 micron by epitaxy. The emitter ballast layer 14 is doped to a concentration of approximately $5 \times 10^{17}$ atoms/cm$^3$, for example.

(f) GaAs buffer layer 13 of n-type GaAs doped to a concentration of approximately $5 \times 10^{18}$ cm$^{-3}$ of thickness of approximately 100 Angstroms is grown on emitter ballast layer 14.

(g) An InGaAs top emitter contact layer 12 doped to a concentration of approximately >$1 \times 10^{19}$ cm$^{-3}$ is then grown on buffer layer 13.

(h) A WSi layer 10 is then sputter deposited on emitter contact layer 12.

(i) A photoresist layer (not shown) is spun on and the transistor emitter is defined. An emitter metal layer 24 of Ti/Pt/Au in thicknesses of, for example, 300/250/3000 Angstroms, respectively, is deposited and then lifted off, resulting in the structure of FIG. 3b.

(j) The emitter contact metal 24 is then used as a natural mask for the subsequent removal of WSi using CF$_4$/O$_2$ plasma reactive ion etching, which results in the structure of FIG. 3c.

(k) A solution of H$_2$SO$_4$:H$_2$O$_2$:H$_2$O in the ratio 1:8:160 (by volume), for example, is then used to etch to base layer 16.

(l) A silicon nitride insulator layer 26 is then deposited to form the structure of FIG. 3d. This layer is then etched using Reactive Ion Etching, but because of the directionality of this technique, the insulator sidewall 26 remains while all of the exposed insulator is removed, as shown in FIG. 3e.

(m) Photoresist (not shown) is again spun on and patterned to define the location of the base contacts 28 and emitter contact 32; this exposes emitter islands 14 and sidewalls 26 in addition to a portion of the base epilayer 16. Ti/Pt/Au metals are evaporated in sequence at thicknesses of, for example, 500, 250 and 1500 Angstroms, respectively, onto the photoresist and exposed areas. The overhanging sidewalls 26 shadow the part of the base epilayer 16 adjacent to emitter 14, so the evaporated metal does not contact emitter 14. The photoresist is then removed which lifts off the metal except the portion 28 which is on the base epilayer 16 and the portion 32 above emitter island 14 and sidewalls 26. The resulting structure is shown in FIG. 3f.

(n) Photoresist (not shown) is then deposited and patterned to define the connection to the subcollector layer 20. Layers 16, and 18 are then etched using a solution of H$_2$SO$_4$:H$_2$O$_2$:H$_2$O in the ratio of 1:8:160 (by volume), for example. Afterwards, AuGe/Ni/Au metals are evaporated onto the wafer to thicknesses of, for example, 500/140/2000 Angstroms, respectively, to form the collector contact 30. The photoresist layer is then stripped, which lifts off all excess metallization, and results in the structure shown in FIG. 3g. The remaining metal is then alloyed at 430° C. for 1 minute, for example.

A fourth preferred embodiment is shown in FIG. 4. A heavily doped (i.e. approximately >$1 \times 10^{19}$ atoms/cm$^3$) InGaAs emitter contact layer 40 is positioned next to a lightly doped (i.e. approximately $5 \times 10^{18}$ atoms/cm$^3$) GaAs buffer layer 42 having a thickness of approximately 100 Angstroms. The GaAs buffer 42 is interposed between the emitter contact 40 and the emitter ballast layer 44. An active emitter layer 46 is interposed between the emitter ballast layer 44 and a GaAs base layer 48. The interface between the active emitter 46 and the base layer 48 can be abrupt, or the Al mole fraction can be graded over a distance of approximately 300 Angstroms, as shown with layer 50. The emitter ballast layer 44 is composed of Al$_x$Ga$_{1-x}$As, where x>0.4, while the active emitter layer 46 is composed of Al$_x$Ga$_{1-x}$As, where x$\leq$0.4. The interface between the emitter ballast layer 44 and the active emitter layer 46 can be abrupt, or the Al mole fraction can be graded between that of the emitter ballast layer 44 and that of the active emitter layer 46. The emitter layers 44 and 46 are doped to a concentration of approximately $5 \times 10^{17}$ atoms/cm$^3$, for example.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An emitter structure for a bipolar transistor, said structure comprising an emitter layer of Al$_x$Ga$_{1-x}$As, where x>0.5, adjacent a base layer whereby said emitter layer acts as a ballast resistor and as the active emitter for said transistor.

2. The emitter structure of claim 1 wherein said emitter and said base are separated by a layer having a graded composition.

3. The emitter structure of claim 1 wherein said emitter layer is doped to a concentration of approximately $5 \times 10^{17}$ atoms/cm$^3$.

4. The structure of claim 1 wherein said base layer is GaAs.

5. A bipolar transistor comprising:

a substrate;

a subcollector layer;

a collector layer;

a base layer;

an emitter layer comprising Al$_x$Ga$_{1-x}$As, where x>0.5.

6. The transistor of claim 5 further comprising:

a buffer layer on said emitter layer;

an emitter contact layer on said buffer layer;

a conductive layer on said emitter contact layer.

7. The transistor of claim 5 wherein said substrate and said subcollector, collector, and base layers are GaAs.

8. The transistor of claim 5 wherein said emitter layer is doped to a concentration of $5 \times 10^{17}$ atoms/cm$^3$.

9. The transistor of claim 6 wherein said buffer layer is GaAs doped to a concentration of $<5 \times 10^{18}$ atoms/cm$^3$.

10. The transistor of claim 6 wherein said emitter contact layer is InGaAs doped to a concentration of approximately $1 \times 10^{19}$ to $2 \times 10^{19}$ atoms/cm$^3$.

11. The transistor of claim 6 wherein said conductive layer is WSi.

12. The transistor of claim 6 wherein said conductive layer is W.

13. An emitter structure for a bipolar transistor, said structure comprising:

a ballast resistor layer of $Al_xGa_{1-x}As$, where x>0.4; and an active emitter layer of $Al_xGa_{1-x}As$, where x≦0.4, adjacent a base layer.

14. The emitter structure of claim 13 wherein said active emitter layer and said base layer are separated by a layer having a graded composition.

15. The emitter structure of claim 13 wherein said active emitter layer is doped to a concentration of approximately $5 \times 10^{17}$ atoms/cm$^3$.

16. The structure of claim 13 wherein said base layer is GaAs.

* * * * *